United States Patent

[11] 3,619,735

[72] Inventors Charles Y. Chen
Putnam Valley;
Vir A. Dhaka, Hopewell Junction; Walter F. Krolikowski, Hopewell Junction, all of N.Y.

[21] Appl. No. 5,453
[22] Filed Jan. 26, 1970
[45] Patented Nov. 9, 1971

[73] Assignee International Business Machines Corporation
Armonk, N.Y.

[54] INTEGRATED CIRCUIT WITH BURIED DECOUPLING CAPACITOR
9 Claims, 7 Drawing Figs.

[52] U.S. Cl. .......... 317/235, 317/101
[51] Int. Cl. .......... H01l 19/00
[50] Field of Search .......... 317/234, 235, 235 (22), 235 (48)

[56] References Cited

UNITED STATES PATENTS

| | | | |
|---|---|---|---|
| 3,260,902 | 7/1966 | Parter | 317/235 |
| 3,404,295 | 10/1968 | Warner, Jr. | 307/302 |
| 3,423,653 | 1/1969 | Chang | 317/235 |
| 3,430,110 | 2/1969 | Goshgarian | 317/234 |
| 3,474,309 | 10/1969 | Stehlin | 317/235 |
| 3,544,863 | 12/1970 | Price et al. | 317/235 |

*Primary Examiner*—James D. Kallam
*Attorney*—Sughrue, Rothwell, Mion, Zinn & Macpeak

ABSTRACT: An integrated circuit and process for making it wherein a decoupling capacitor is provided beneath devices in the surface of the integrated circuit by the formation of a first epitaxial layer between an $N^+$ substrate having a $P^+$ zone diffused therein and an $N^1$ device-containing epitaxial layer. A $P^+$ channel diffusion to the $P^+$ zone formed in the substrate will serve as a damping resistor in combination with the coupling capacitor. The process for forming such a decoupling capacitor in an integrated circuit comprises, inter alia, diffusing $P^+$ impurities into the substrate to form a large junction which will subsequently function as a decoupling capacitor. A first intrinsic, $P^1$ or $N^1$ epitaxial layer is then grown on the semiconductor substrate. Subsequently, an $N^1$ epitaxial layer is grown on the first epitaxial layer. A $P^+$ channel is then driven through the $N^1$ epitaxial layer and the first epitaxial layer to contact the $P^+$ diffused zone which serves as the decoupling capacitor. This $P^+$ channel diffusion will serve as a damping resistor in combination with the decoupling capacitor. Device diffusion, i.e., transistors, resistors, etc., will take place into the $N^1$ epitaxial layer, and during growth of the epitaxial layers the $P^+$ zone will significantly outdiffuse into the first epitaxial layer. Appropriate channels, isolations and contacts are also provided.

FIG. 1 STEP 1
FIG. 2 STEP 2
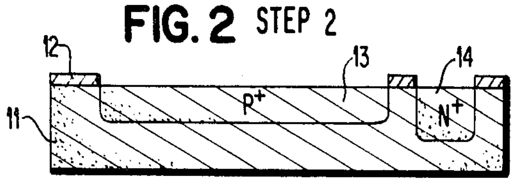
FIG. 3 STEP 3
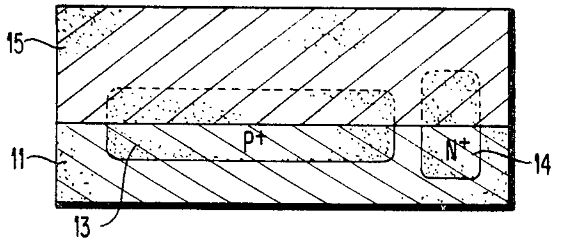
FIG. 4 STEP 4
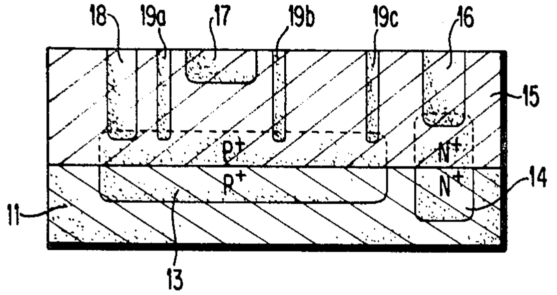
FIG. 5 STEP 5
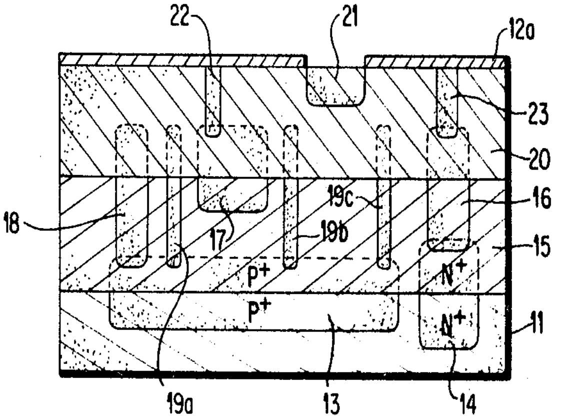
FIG. 6 STEP 6
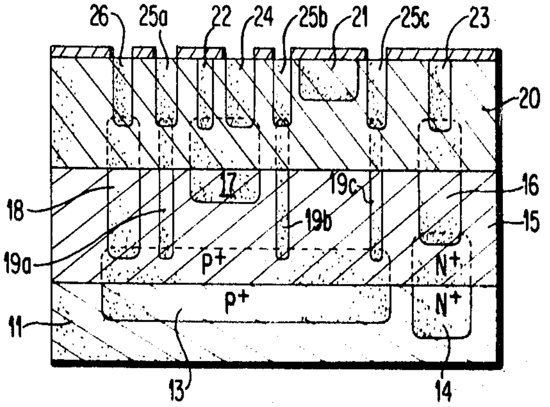
FIG. 7 STEP 7
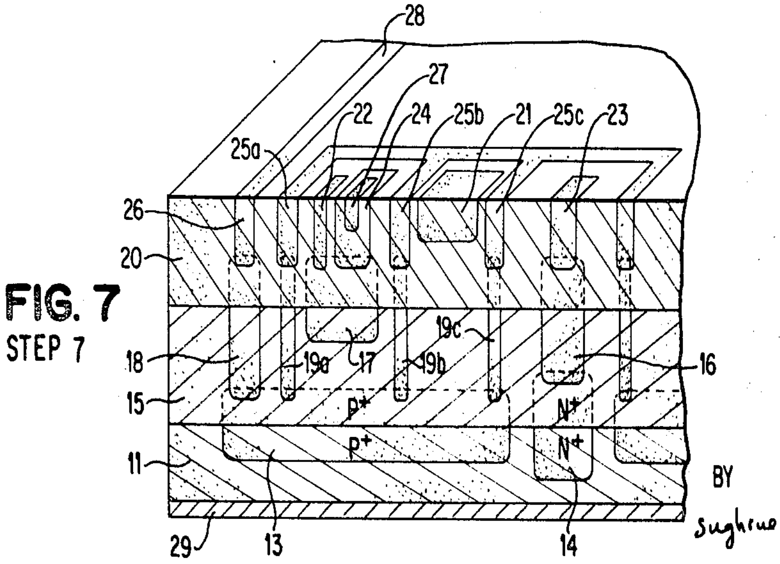
INVENTORS
CHARLES Y. CHEN
VIR A. DHAKA
BY WALTER F. KROLIKOWSKI
Sughrue, Rothwell, Mion, Zinn & Macpeak
ATTORNEYS

INTEGRATED CIRCUIT WITH BURIED DECOUPLING CAPACITOR

BACKGROUND OF THE INVENTION

1. Field of the Invention

The present invention relates to integrated circuits and processes for forming the same.

2. Description of the Prior Art

In many integrated circuits a $P^1$ epitaxial layer must be deposited upon an $N^+$ substrate whereby the $P^1$ epitaxial layer per se acts as a damping resistor in series with a decoupling capacitor.

When circuits are switching, due to inductance in the circuit electrical noise is generated. A damping resistor and decoupling capacitor connected in series and which are connected in parallel with the switching circuits are used to damp out electrical noise. The value of the damping resistor is important because it controls the magnitude of damping.

In circuits wherein such a structure is required, it has been found that it is extremely difficult to deposit the $P^1$ epitaxial layer to the exact resistivity and thickness tolerances necessary to meet standard state of the art electrical requirements. This is because it is essentially the geometry of the $P^1$ epitaxial layer which decides the device characteristics. Since this is the case, variation in the $P^1$ epitaxial layer (which is very difficult under any circumstances to form on a uniform basis) greatly effects the device characteristics, principally resistivity.

It has been proposed, to overcome the above faults, to utilize the sheet resistivity of the $P^+$ side of such a decoupling capacitor as a damping resistor. In this case, the $P^1$ epitaxial layer no longer acts as a series resistor. However, such a scheme is subject to several disadvantages. First, it is difficult to control damping resistor values. Second, associated capacitive coupling between devices is too high for high-speed switching circuits.

Further requirements in the present art are that the decoupling capacitor which lies beneath the transistors and resistors formed in the surface of the integrated circuit has a large area, and that power distribution take place from the back of the integrated circuit chip or substrate.

SUMMARY OF THE INVENTION

The present invention provides a scheme for forming multilevel integrated circuit structures. The decoupling capacitor is formed on the $N^+$ substrate silicon wafer by a diffusion technique. The damping resistor is formed by utilizing a $P^+$ channel diffusion. The damping resistor is in a vertical direction which is in contrast with the standard resistor which is in the horizontal direction. One side of the resistor is directly connected to the decoupling capacitor. The other side of the resistor is connected to the surface of the silicon chip. The damping resistor value can be designed by properly chosen contact hole size and location. The $P^+$ channel diffusion is also an isolation diffusion which electrically isolates the active devices from each other. In addition, the exact sheet resistivity control for the $P^+$ epitaxy resistivity which is required for a damping resistor is not required in this scheme. The resistivity of the epitaxy over the substrate can be $P^1$, intrinsic or $N^1$. This epitaxy is necessary in this invention.

One object of the present invention is thus to provide a process for manufacturing an integrated circuit utilizing an epitaxial layer over a substrate having a $P^+$ diffused zone formed therein which serves as a decoupling capacitor. It is a further object of this invention to provide a $P^+$ channel which reaches through to said $P^+$ diffused zone, said $P^+$ channel thereby providing an improved damping resistor in combination with said $P^+$ diffused zone which serves as a decoupling capacitor.

It is a further object of this invention to provide an integrated circuit wherein fabrication steps are greatly simplified over the prior art and wherein processing criticality is greatly reduced.

The integrated circuit produced by this process comprises, in the described embodiment, an $N^+$ substrate having diffused therein a $P^+$ region. A first epitaxial layer, preferably intrinsic though slightly $P^1$ or $N^1$ can be used, is grown over the $N^+$ substrate having the $P^+$ region diffused therein.

During deposition of the first epitaxial layer, $P^+$ impurities from the substrate diffuse into the $P^+$, intrinsic or $N^1$ epitaxy. Over the $P^1$, intrinsic or $N^1$ epitaxial layer there is then grown an $N^1$ epitaxial layer which will contain the active devices.

The next step in the process, which forms one of the most important features of the process, is to drive a $P^+$ channel down through the $N^1$ epitaxial layer and the first preferably intrinsic epitaxial layer to the $P^+$ diffused region which forms the decoupling capacitor. This $P^+$ channel forms the damping resistor, and, by appropriate selection of the thickness and concentration level of this $N^1$ channel, the properties, i.e., resistance, etc., of the damping resistor can be easily varied.

Thus, whereas the prior art had to very carefully control the formation of the first epitaxial layer, since the total layer itself served as the damping resistor, the present invention overcomes this critical requirement for uniformity of the prior art by using a $P^+$ channel as the damping resistor. The characteristics of the $P^+$ channel can be very easily controlled and thus this provides a simple means of controlling the device characteristics. Further, the use of the $P^+$ channel as a damping resistor enables the heretofore exacting deposition requirements of the prior art $P^+$ epitaxial layer to be obviated, and the present invention can utilize an intrinsic epitaxial layer or even lightly doped $N^1$ or $P^1$ epitaxial layers. In fact, the only characteristic that the epitaxial layer of the present invention must exhibit, be it intrinsic, $N^1$ or $P^1$, is that it must illustrate a high resistivity, e.g., greater than about 10 ohms-cm. The prior art, of course, had to use a $P^+$ epitaxial layer, and both resistivity and thickness had to be critically controlled to gain reproducible device characteristics.

Of course, appropriate isolations, etc., are required to form an operable device, and those are well within the skill of the art.

The process of the present invention is based upon the novel sequence of steps which have been found necessary to form the above device, these steps comprising, inter alia, forming a $P^+$ diffusion in the $N^+$ (silicon) substrate, thereby forming the large area junction that will be the decoupling capacitor, growing the intrinsic (as mentioned, a lightly doped $N^1$ or $P^1$ epitaxial layer could also be used) epitaxial layer of high resistivity on the $P^+$ diffused $N^+$ substrate, and thereafter growing the $N^1$ epitaxial layer on top of the intrinsic epitaxial layer. Of course, after the $N^1$ epitaxial layer is grown on top of the intrinsic epitaxial layer, the $P^+$ channel is driven down through the $N^1$ epitaxy and intrinsic, $P^1$ or $N^1$ epitaxy layer to reach, or make electrical contact with, the $P^+$ diffused zone which is to form the decoupling capacitor. This vertically oriented $P^+$ channel will serve as a damping resistor, and serves as one of the most novel features of the present invention. Various diffusions for forming isolations, bases, emitters, etc., are required as will be clear in view of the following detailed description of the preferred embodiments of this invention taken in conjunction with the drawings.

Therefore, another object of the present invention is to provide integrated circuits having improved electrical isolation between the elements thereof by the use of a $P^+$ doped zone which serves as a decoupling capacitor in conjunction with a $P^+$ doped channel which acts as a damping resistor in series with the decoupling capacitor.

Another object of the present invention is to provide an integrated circuit having extremely low capacitive coupling in combination with an easily formed damping resistor structure.

Still another object of the present invention is to provide an integrated circuit which has an extremely large area decoupling capacitor, as large as 100×100 mils, beneath the devices formed in the surface thereof, and which provides power distribution from the back of the substrate or integrated circuit chip.

Yet another object is to provide an integrated circuit wherein vertical $P^+$ diffusions, in combination with the $P^+$ decoupling capacitor, can be used as $P^+$ device isolations.

These and other objects of the present invention will become clearer from a reading of the following material.

BRIEF DESCRIPTION OF THE DRAWINGS

Steps 1 to 7 of the drawings illustrate an improved integrated circuit and a process for making the same in accordance with one embodiment of this invention.

DETAILED DESCRIPTION OF THE PREFERRED EMBODIMENTS

Referring now to Step 1 of the drawings, one specific method in accordance with the teachings of the present invention will be presented.

The process begins with the preparation of a slice of $N^+$ conductivity silicon 11, typically 0.01 ohms-cm., and 8 mils thick. The thickness and conductivity are substantially noncritical. However, it is generally required that the substrate illustrate high conductivity, below about 0.01 ohms-cm.

In Step 2, a mask 12 which was a silicon dioxide about 5,000 A. thick, was formed on the surface of the $N^+$ silicon substrate 11. Firstly, $P^+$ boron diffusion was performed into the $N^+$ substrate. This yields the large area junction about 100×100 mils that forms the decoupling capacitor 13. Diffusion was at a high temperature (1,000° C.) with a gaseous atmosphere containing the boron impurities to a $C_0$ of $10^{19}$ atoms/cc. and to a depth of $1\mu$. Indium or gallium (where a different mask material is used) could also be utilized, as could any representative $P^+$ impurity. Of course, the mask was opened over the $P^+$ region 13 during this diffusion. After completion of the $P^+$ region, the mask 12 was regrown, and was next opened over the $N^+$ channel 14 which is formed in the substrate 11. Of course, the regrown silicon dioxide mask 12 is permitted to cover the $P^+$ zone 13 during this step. Phosphorus diffusion was carried out at 1,000° C. from a $POCl_3$ atmosphere to a phosphorus concentration of $10^{20}$ atoms/cc. Any state of the art procedure can be used to realize this concentration level, as could other $N^+$ impurities such as arsenic, etc. This $N^+$ channel 14 will provide for current distribution from the rear surface of the substrate or chip 11. The channel 14 was diffused to a depth of several microns.

In Step 3 the silicon dioxide mask 12 is completely removed, and an intrinsic epitaxial layer, or lightly doped $N^1$ or $P^1$, of high resistivity is grown upon the substrate 11. This, of course, forms one of the greatest advantages of the present invention over the prior art. The prior art utilized this complete epitaxial layer 15 as the damping resistor itself. Thus, it was necessary to observe critical tolerances on the thickness and resistivity of the $P^1$ epitaxial layer. Of course, the layer had to be $P^1$. In contradistinction, the present invention does not use this epitaxial layer as the damping resistor, and does not, in fact, require a $P^1$ impurity type. Further, this epitaxial layer is preferably intrinsic, although a light doping, say $10^{15}$–$10^{16}$ atoms/cc. can also be used, either $P^1$ or $N^1$. In this instance, the intrinsic epitaxial silicon layer 15 was grown by the reduction of $SiH_4$ at 1,150° C. The thickness of the epitaxial layer was approximately 6 microns though it will be appreciated that the thickness is substantially noncritical so long as sufficient resistivity and thickness are provided to reduce capacitive coupling between the active devices and the decoupling capacitor. Usually, thickness can vary from 5 to 7 microns, and the resistivity can vary from 1 to 100 ohms-cm., with a minimum resistivity of 10 ohms-cm. being preferred and a minimum of 15 ohms-cm. being most preferred. In this example the resistivity was 10 ohms-cm.

In this case, the intrinsic epitaxial layer 15 was, of course silicon. As illustrated by the dotted lines immediately above the diffused $P^+$ zone 13, some out-diffusion of the $P^+$ phosphorus zone 13 into the silicon epitaxial layer 15 will occur and is, in fact, necessary to this invention. It is important that during subsequent processing steps out-diffusion does not occur beyond the area of the intrinsic epitaxial layer 15. In the present instance, out-diffusion occurred about 2–3 microns into the intrinsic epitaxial layer.

As illustrated in Step 4 of this invention, $N^+$ phosphorus diffusion is performed into the intrinsic epitaxial layer 15 to form an $N^+$ channel 16 for current distribution. The $N^+$ material utilized, phosphorus, was diffused to a concentration of $10^{20}$ atoms/cc. Diffusion was at 1,000° C., using the heretofore described phosphorus diffusion method. Of course, the remainder of the device surface was masked with a silicon dioxide layer 5,000° A. thick during this diffusion.

Also shown in Step 4 is the $N^+$ subcollector 17 diffusion into the epitaxial layer 15. The $N^+$ subcollector 17 is formed by an arsenic diffusion to a concentration of $10^{21}$ atoms/cc. Diffusion was at 1,100° C. using a high-temperature arsenic containing atmosphere. After the phosphorus diffusion, of course, the silicon dioxide mask is regrown and then removed over the area where the subcollector region 17 is to be diffused.

At this point, another one of the most important features of this invention will be described in detail. This is the formation of the $P^+$ channel 18 which is, of course, the damping resistor of this invention which functions, in combination with the $P^+$ diffused zone 13 (the decoupling capacitor), to provide the advantages of this invention. This $P^+$ diffused channel will typically have a concentration much higher than that of the surrounding epitaxial layer 15, for instance, orders of magnitude higher in the range of $10^{18}$–$10^{19}$ atoms/cc. In this example, it was $10^{19}$ atoms/cc. of boron. This is substantially noncritical, and merely representative. In any case, this $P^+$ channel 18 is formed by a boron diffusion into the intrinsic epitaxial layer 15. In this instance, diffusion was at about 1,050° C. using a high-temperature gaseous (boron) atmosphere. This procedure is well known in the art and need not be described further. In this example, though such is not mandatory, isolation diffusions 19*a*, 19*b*, and were performed simultaneously with the formation of the $P^+$ damping resistor diffusion 18. These isolations, of course, separate the transistors, etc. in the device.

Although not mandatory, these isolations, e.g., 19*a* and 19*b*, form another unique aspect of this invention. By forming these isolations simultaneously with the channel 18, fabrication is simplified. However, in combination with decoupling capacitor 13, these channels 19*a* and 19*b* enable $P^+$ isolations to be formed around devices.

It is necessary to emphasize that it is the damping resistor 18 which permits the main advantages of this invention to be obtained. As heretofore indicated, the prior art used the total epitaxial layer 15 itself as the damping resistor. Control was so difficult that this proved to be the stumbling block in forming devices of the type under consideration. Needless to say, in this invention an impurity containing channel serves as the resistor, and the properties of this "doped" resistor are very easily controlled by the doping atmosphere, impurity used, concentration, etc., is very simple.

Power in and power out leads will typically be attached to substrate 11 and element 26, respectively. In the prior art, since the epitaxial layer 15 served as a damping resistor, no centralized power takeoff region existed. In this invention, the channel 18 serves as a power removal source, permitting easy control of the resistance since, as concentration of the impurities in $P^+$ channel 18 is increased, resistance lowers, and as concentration is lowered, resistance increases. Thus, since the $P^+$ diffusion used to form the decoupling capacitor 13 is easily controlled, and the $P^+$ diffusion to form channel 18 is easily controlled, one can obtain a device by a greatly simplified process which permits improved device tolerance control to be obtained.

The end result is, of course, a very even distribution of power to devices all along the surface of the monolithic semiconductor chip.

With reference to Step 5, $N^1$ epitaxial layer 20 is now grown over the intrinsic epitaxial layer 15 by the reduction of $SiH_4$ at 1,150° C. The N-type impurity was arsenic, present in a concentration of $10^{15}$ atoms/cc. The thickness of the $N^1$ epitaxial layer 20 was approximately 2 microns. During the growth of the $N^1$ epitaxial layer 20, out-diffusion of the various diffused zones formed in the intrinsic epitaxial layer 15 will occur, and these out-diffusions are shown by the individual zones formed directly above initial diffusion zones 16, 17, 18 and 19*a, b* and *c*. They are represented in Step 5 by dotted lines.

Step 5 further comprises the formation, by diffusion, of the resistor 21, which can be either a N or P-type diffusion, after, of course, appropriate mask formation (silicon dioxide) to expose only the area wherein resistor 21 is to be formed. The depth of the resistor was 10,000 A. The silicon dioxide mask was 4,000 A. thick. After this diffusion and regrowing the silicon mask over zone 21, holes are opened over both the subcollector 17 and the $N^+$ channel 14 and $N^+$ diffusion is performed to a concentration of $10^{20}$ atoms/cc. The well-known gaseous phosphorous technique was used at 1,000° C. These two diffusions are performed simultaneously thereby providing an $N^+$ channel 22 to the subcollector 17 and an $N^+$ channel 23 to the distribution channel 14. It is only necessary that appropriate electrical contact be made.

As shown in Step 6, simultaneous $P^+$ diffusions are performed to reach the base, decoupling capacitor and to form $P^+$ isolations. In greater detail, the silicon dioxide layer 12*a* is first regrown completely over the top of the $N^1$ epitaxial layer 20, and holes are open, respectively, over the diffusions 18, 19*a*, 17, 19*b* and 19*c*. Through these holes $P^+$ diffusion is conducted with a boron containing gaseous atmosphere to a concentration of $10^{19}$ atoms/cc. This well-known boron diffusion technique at 1,050° C. was used. The diffusion of Step 6 results in the $P^+$ base contact diffusion 24 which contacts the base regions 17; in $P^+$ isolation diffusions 25*a*, 25*b*, and 25*c*, which, respectively, reach through and contact the isolations 19*a*, 19*b* and 19*c*; and in the $P^+$ contact 26 which reaches through the $N^1$epitaxial layer 20 to contact the out-diffused portion of the $P^+$ boron diffusion 18 which extends partially through the intrinsic epitaxial layer to reach the $P^+$ diffused decoupling capacitor zone 13. The isolations 25*a* and 25*b* are an important and novel feature of this invention for the reasons heretofore offered with respect to isolations 19*a*, 19*b*.

Step 7 illustrates the final operations which are performed for instance, an $N^+$ emitter diffusion using phosphorus is performed by any standard state of the art process to form emitter 27. Large area metal contacts can then be attached to the reach through 26 which contacts the decoupling capacitor 13, the metal contacts being illustrated by numeral 28, thereby yielding a low resistance contact to the decoupling capacitor 13. Finally, a metal contact 29 can be formed to the back of the wafer 11 for current distribution.

In the heretofore offered discussion, the material used to form the multilayer device structure was silicon. It will be obvious that within the parameters of this invention other semiconductor materials could be used. Further, other $P^+$ and $N^+$ impurities could be used. Although diffusion was used in the example, it should be understood that any comparable method can be used, so long as the object of forming a so-called "doped" region is realized. Obviously, the epitaxial growth techniques in the example are only representative, and other comparable methods can be substituted.

While the invention has been particularly shown and described with reference to a preferred embodiment thereof, it will be understood by those skilled in the art that various changes in form and details may be made therein without departing from the spirit and scope of the invention.

What is claimed is:

1. An integrated circuit semiconductor device comprising a substrate of one conductivity type;

a $P^+$ region within and forming a capacitor with said substrate;

a first epitaxial layer of greater resistivity than said $P^+$ region formed on said substrate and over said $P^+$ region;

a second epitaxial layer of $N^+$ conductivity type and greater resistivity than said $P^+$ region formed over said first epitaxial layer;

a $P^+$ channel extending through both of said epitaxial layers and electrically contacting said $P^+$ region, said $P^+$ channel forming a resistor connected to said $P^+$ region for providing a damping resistor and decoupling capacitor combination; and circuit elements formed within said second epitaxial layer.

2. An integrated semiconductor device in accordance with claim 1 wherein said first epitaxial layer is either $N^1$ or $P^1$ conductivity type.

3. An integrated semiconductor device of claim 1 wherein said first epitaxial layer has a resistivity greater than 10 ohms-cm.

4. The integrated circuit semiconductor device of claim 1 wherein said circuit element includes:

an emitter region of the opposite conductivity type from said $P^+$ region in said substrate; and a base region of the same conductivity type as said $P^+$ base region.

5. The integrated circuit semiconductor device of claim 1 wherein additional $P^+$ channels extend through both of said epitaxial layers and electrically contact said $P^+$ region, whereby at least one of said circuit elements is isolated by said additional $P^+$ channels in combination with said $P^+$ region.

6. The integrated circuit semiconductor device of claim 1 wherein said $P^+$ region is a $P^+$ diffused region.

7. The integrated circuit semiconductor device of claim 5 wherein said additional $P^+$ channels are formed simultaneously with said $P^+$ resistor channel.

8. The integrated circuit semiconductor device of claim 1 further comprising an $N^+$ conductivity-type region of less resistivity than said second epitaxial layer extending from said circuit elements within said second epitaxial layer through said first epitaxial layer and making electrical contact with said substrate.

9. The integrated circuit semiconductor device of claim 8 further comprising means for connecting a power source with the surface of said substrate opposite said $P^+$ region in said substrate, whereby power is distributed from said substrate via said $N^+$ conductivity-type region to said circuit elements within said second epitaxial layer.

* * * * *